(12) United States Patent
Arbabian et al.

(10) Patent No.: US 11,601,019 B2
(45) Date of Patent: Mar. 7, 2023

(54) RF-ULTRASOUND RELAY FOR EFFICIENT POWER AND DATA TRANSFER ACROSS INTERFACES

(71) Applicant: The Board of Trustees of the Leland Stanford Junior University, Stanford, CA (US)

(72) Inventors: Mohammad Amin Arbabian, San Francisco, CA (US); Chun-Ming Ernest So, Stanford, CA (US); Jayant Charthad, Stanford, CA (US); Ting Chia Chang, Stanford, CA (US); Max Li-Hua Wang, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 274 days.

(21) Appl. No.: 16/754,543

(22) PCT Filed: Oct. 11, 2018

(86) PCT No.: PCT/US2018/055417
§ 371 (c)(1),
(2) Date: Apr. 8, 2020

(87) PCT Pub. No.: WO2019/075203
PCT Pub. Date: Apr. 18, 2019

(65) Prior Publication Data
US 2020/0257136 A1    Aug. 13, 2020

Related U.S. Application Data

(60) Provisional application No. 62/570,743, filed on Oct. 11, 2017.

(51) Int. Cl.
*G02C 7/04* (2006.01)
*H02J 50/15* (2016.01)
(Continued)

(52) U.S. Cl.
CPC ............ *H02J 50/50* (2016.02); *G02C 7/04* (2013.01); *H02J 50/15* (2016.02); *H02J 50/20* (2016.02); *H02J 50/80* (2016.02)

(58) Field of Classification Search
CPC ............ H02J 50/15; H02J 50/20; H02J 50/50; H02J 50/502; H02J 50/80; G02C 7/04
See application file for complete search history.

(56) References Cited

U.S. PATENT DOCUMENTS

| | | | |
|---|---|---|---|
| 9,884,180 B1* | 2/2018 | Ho | A61N 1/3787 |
| 2007/0115137 A1* | 5/2007 | Lyon | G01S 13/767 340/8.1 |

(Continued)

OTHER PUBLICATIONS

Meng et al, "A Hybrid Inductive-Ultrasonic Link for Wireless Power Transmission to Millimeter-Sized Biomedical Implants", 2016, IEEE Trans. Circuits and Systems II: Express briefs v64n10, pp. 1137-1141.

(Continued)

*Primary Examiner* — Daniel Cavallari
*Assistant Examiner* — Rasem Mourad
(74) *Attorney, Agent, or Firm* — Lumen Patent Firm

(57) ABSTRACT

A hybrid RF-acoustic relay is provided where some but not all of the incident RF power is rectified to power the relay and, optionally, to provide power for further link features. The remaining fraction of the incident RF power is used to directly drive an acoustic transceiver array in communication with one or more acoustically powered nodes. In this manner, power, control and communication can be efficiently provided to acoustically powered nodes even in situations where an RF link or an acoustic link would perform poorly.

16 Claims, 7 Drawing Sheets

(51) Int. Cl.
  *H02J 50/20*    (2016.01)
  *H02J 50/50*    (2016.01)
  *H02J 50/80*    (2016.01)

(56) References Cited

U.S. PATENT DOCUMENTS

| | | | |
|---|---|---|---|
| 2009/0036780 A1 | 2/2009 | Abraham | |
| 2009/0102443 A1* | 4/2009 | Smith | B06B 1/0269 |
| | | | 323/282 |
| 2010/0160786 A1 | 6/2010 | Nordgren | |
| 2010/0249562 A1* | 9/2010 | Zhang | G01B 9/0203 |
| | | | 600/443 |
| 2011/0059716 A1* | 3/2011 | Cork | H03F 7/04 |
| | | | 455/330 |
| 2011/0075715 A1* | 3/2011 | Kravitz | H04B 1/0475 |
| | | | 375/221 |
| 2015/0102681 A1 | 4/2015 | Leabman | |
| 2017/0209127 A1 | 7/2017 | Raghunathan | |
| 2017/0271919 A1* | 9/2017 | Von Novak, III | H02J 50/50 |
| 2018/0351412 A1* | 12/2018 | Gabriel | H04B 5/0056 |

OTHER PUBLICATIONS

Sanni, "A Three-tier bio-implantable sensor monitoring and communications platform", 2013, Ph.D. dissertation.
Sanni et al., "Inductive and Ultrasonic Multi-Tier Interface for Low-Power, Deeply Implantable Medical Devices", 2012, IEEE Trans. Biomedical Circuits and Systems v6n4.
Seo et al., "Neural Dust: An Ultrasonic, Low Power Solution for Chronic Brain-Machine Interfaces", 2013, arXiv:1307.2196v1.

* cited by examiner

RF-ULTRASOUND RELAY FOR EFFICIENT POWER AND DATA TRANSFER ACROSS INTERFACES

FIELD OF THE INVENTION

This invention relates to hybrid RF-acoustic links for providing power (and optionally data communication) to acoustic devices.

BACKGROUND

Acoustically powered devices are under consideration for various applications, including medical implants. One challenge for such implants is providing power to them, because it is often challenging to acoustically transmit power to an acoustically powered implant. Achieving a good acoustic contact with skin of a user can be a burden on the user, and the acoustic power may need to pass through body parts having high acoustic attenuation to reach the implant. For example, an acoustically powered retinal implant would face significant design difficulties because of high acoustic attenuation from bone in the skull through which the acoustic energy would need to travel when powering is done from the side of the head.

Such considerations have motivated the investigation of hybrid RF-acoustic links, where part of the link is electromagnetic (i.e. RF) and the other part of the link is acoustic. For example, a hybrid RF-acoustic link to acoustic nodes in the brain of a patient could use a relay positioned under the skull of the patient. Such a relay would be in acoustic communication with the implants in the brain, and also be in RF communication with an external unit. In this approach, transmission through the skull is RF, not acoustic, thereby avoiding the problem of high acoustic attenuation in the skull.

Conventional implementations of communication link relays generally fall into two categories. The first and most conventional approach is to rectify all incoming RF power and use the resulting on-relay DC voltage as a main power source for all communication and control functions of the relay, including driving the acoustic transducers of the array. This approach provides maximum design flexibility (e.g., the RF frequency and the acoustic frequency of the transducers can be the same or they can be different).

The second conventional approach is a more recent approach where the acoustic transducers in the relay are directly driven by the incident RF power, without any intermediate rectification. This approach sacrifices design flexibility for increased efficiency. For example, the RF frequency and acoustic frequencies need to be the same with this approach, but power losses associated with the rectification of the first approach are avoided.

Since this design trade-off can be a difficult one in practice, it would be an advance in the art to provide improved hybrid RF-acoustic relays.

SUMMARY

In this work, the above-mentioned problems are mitigated by a power splitting approach where some of the incident RF power is rectified and used to power the relay, and the remainder of the incident RF power is used to directly drive the acoustic transceivers without being rectified.

In one example, this approach provides a system and method where RF power is used to efficiently transfer power across an interface to an RF-to-acoustic relay. The relay converts the RF energy to ultrasonic energy that powers one or more acoustically powered nodes. In some embodiments, the RF and ultrasonic links can be used for downlink data communication, uplink data communication, ultrasonic imaging or any combination of these functions.

In another example, this approach provides a method and system where RF power is used to efficiently transfer power across an interface to an RF-to-acoustic relay. The relay converts the RF energy to ultrasonic energy that powers one or more acoustically powered nodes. The ultrasonic energy can be steered or focused to desired points in space. In some applications, this can be used to power and/or communicate with multiple acoustically powered nodes. In some embodiments, the RF and ultrasonic links can be used to for downlink data communication, uplink data communication, ultrasonic imaging or some combination of these functions.

Significant advantages are provided. By splitting incident power in this way, the power loss associated with rectification can be incurred only for that fraction of the incident power that really needs to be rectified, leaving the remaining power free for efficiently direct driving the acoustic transceivers of the relay. Tunable matching to the acoustic transceiver can be done that allows direct driving at selectable frequencies, adding an additional design variable and degree of freedom. The tuning can also be done in real time to account for changes in the acoustic transceiver due to varying conditions.

DETAILED DESCRIPTION

Figure 1:
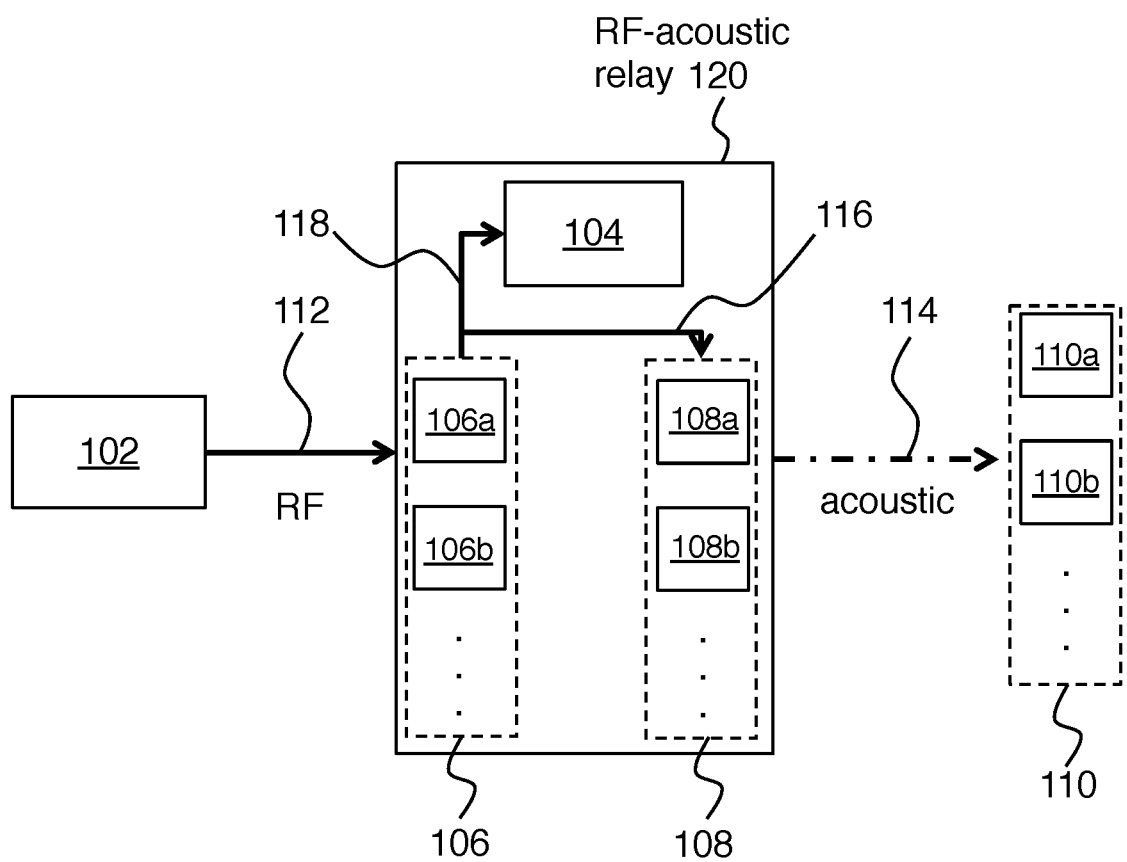
FIG. 1 shows a first exemplary system including a first embodiment of the invention.

FIG. 1 shows a first exemplary system including a first embodiment of the invention. Apparatus 120 is configured as a hybrid RF-acoustic relay unit. It includes one or more RF transceivers 106 (individually referenced as 106*a*, 106*b*, . . . ) configured to receive received RF signals 112 from an external RF unit 102. Relay 120 also includes one or more acoustic transceivers 108 (individually referenced as 108*a*, 108*b*, . . . ) configured to transmit transmitted acoustic signals 114 to one or more acoustically powered nodes 110 (individually referenced as 110*a*, 110*b*, . . . ). In some embodiments, each acoustically powered node 110 may contain one or more acoustic transducer elements. Power for relay 120 is provided by rectifying some but not all of the incident power provided by the received RF signals 112. A remaining part of the incident power provided by the received RF signals is used to directly drive the one or more acoustic transceivers 108. Here that power split is shown schematically with rectifier 104 receiving power 118 and remaining power 116 being used to directly drive the acoustic transceivers 108. In this example, the embodiment of the invention is relay 120.

RF transceivers 106 receive RF power from the external unit or ambient sources. In one embodiment, this may be a coil for inductive power transfer, an antenna, or an array of coils or antennas. In some forms, it may receive and transmit data. External RF unit 102 provides RF energy to the RF-acoustic relay. In some embodiments it may also transmit data, receive data, or any combination of these. It may include a coil, an antenna, multiple coils and/or antennas. The preferred frequency range is dependent on the application, but generally carrier frequencies between 100 kHz to around 15 MHz are used for both the RF and acoustic signals for implant applications. Using direct drive the frequencies for RF and acoustic signals are the same. The link for data communication can use the same frequency, different frequency, the same transducer element or different transducer elements, or any combination of these compared to the power signal. Data communication links could use different modulation schemes such as amplitude, frequency, and phase modulation or any combination of these. In a preferred embodiment, the data received from 112 and the data sent on 114 are amplitude modulated onto the power signals. Uplink signals such as 206 and 212 on FIG. 2 may use multiple input multiple output (MIMO) techniques using multiple acoustic transceivers and/or RF transceivers to maximize the amount of data sent. MIMO refers to using multiple acoustic or RF transceivers for transmitting either from the relay 220 or acoustically powered nodes 110 and for receiving either from the relay 220 or acoustically powered nodes 110. Furthermore, the frequencies used for data communication can be distributed across the above mentioned frequency range. In addition, the transceivers and frequencies used for the two directions of data transfer to and from the relay can use the same frequency or different frequencies. In one implementation when they operate at the same frequency, the signals are time multiplexed.

Preferably relay 120 is configured such that 60% or less of the incident power provided by the received RF signals is rectified to provide power for the relay. Preferably this fraction is as low as possible, but many different values are possible depending on the system configuration and the details of how the overall design is optimized. The rectified power can be used to drive various DC switch/impedance configurations, as in the examples shown below, so the minimum dissipated power is due to leakage which depends on the technology used. For example, if this leakage number is 1 mW for the entire array of acoustic transceivers, then if 100 mW passes through the relay, 1% would need to be rectified; however if 1 W passes through the relay then only 0.1% needs to be rectified.

In cases where the link is enhanced with data communication capability and/or other functions, additional rectified power will be needed according to the power consumed by these extra features. For example, in cases where 2-bit or higher phase control of the acoustic transceivers is employed, the required amount of rectified power can be significantly higher. E.g., if in the example of FIG. 5 below we assume the 4 switch configuration is used to generate 0 and 180 degrees phase and the variable signal generator 502 generates 90 and 270 degrees phase, then the rectified power used for the variable signal generator is on average around 50% of the incident power. The additional 10% can account for variation with different focal points and additional power consumed for other functions (signal processing, data receiver/transmitter circuits, processor, etc.).

Figure 2:
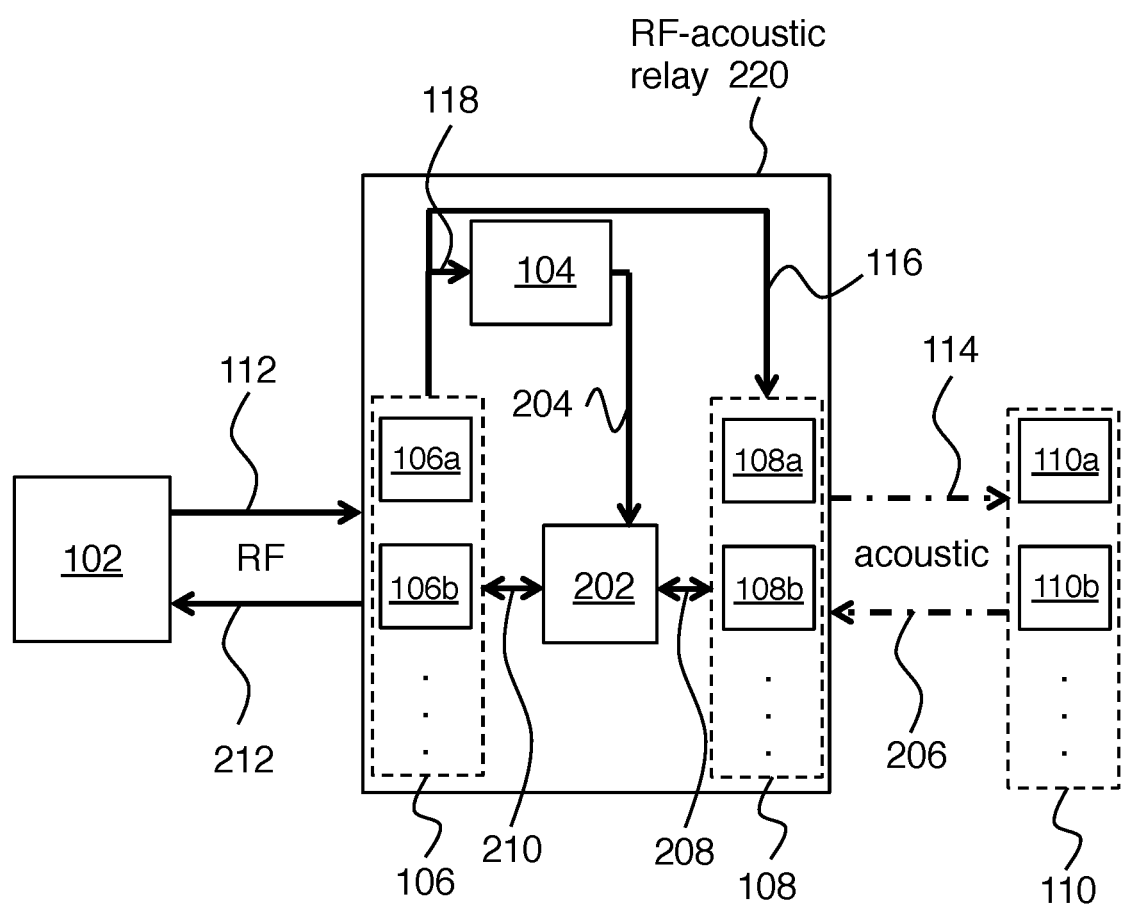
FIG. 2 shows a second exemplary system including a second embodiment of the invention.

The example of FIG. 1 is a unidirectional link to most clearly show the basic features of embodiments of the invention. In practice it will be preferred for such links to be bidirectional, and preferably also including both power transfer and data links. FIG. 2 shows a second exemplary system including a second embodiment of the invention. This example is like the example of FIG. 1, except that the hybrid RF-acoustic relay 220 includes an on-board processor 202 (typically a multi-input, multi-output processor) powered by power 204 from rectifier 104. Here the one or more RF transceivers 106 are also configured to transmit transmitted RF signals 212 to the external RF unit 102. Similarly, the one or more acoustic transceivers 108 are also configured to receive received acoustic signals 206 from the one or more acoustically powered nodes 110. Here signals 112, 114, 206 and 212 are taken to include power, control and data as needed.

Figure 3:
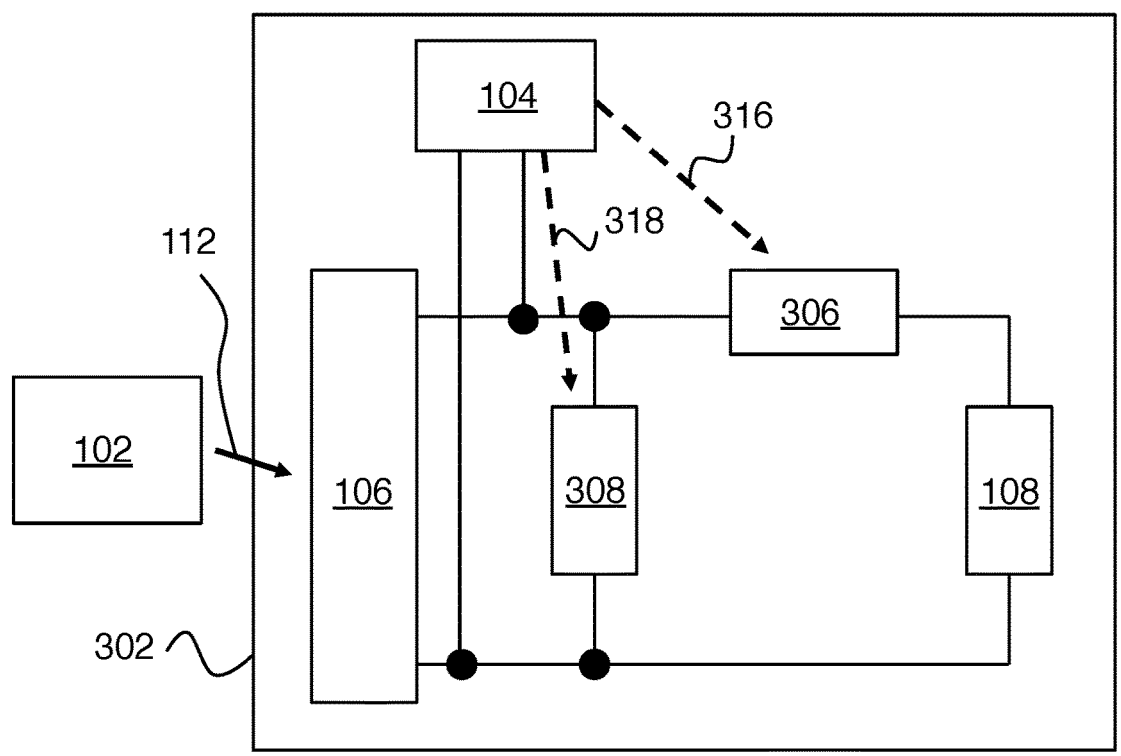
FIG. 3 schematically shows two approaches for power splitting in a hybrid RF-acoustic relay.
Figure 3:
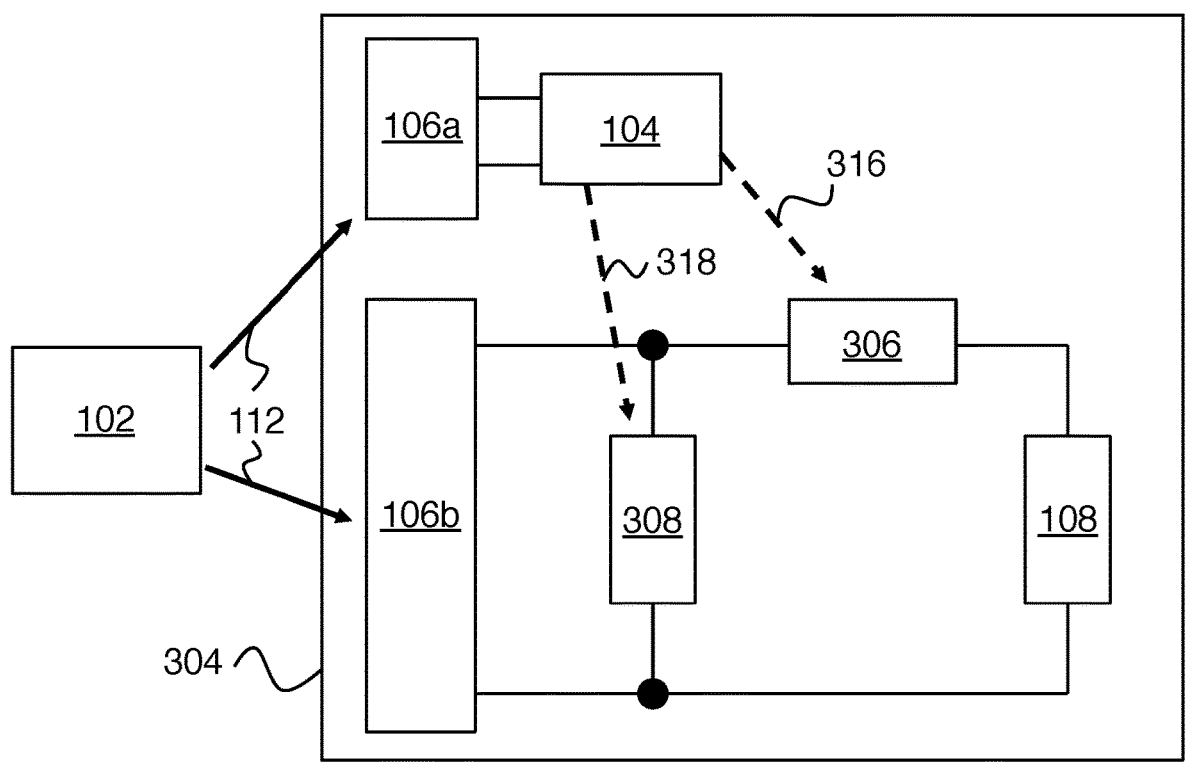

Practice of the invention does not depend critically on how the power splitting between the rectifier and the direct driving is accomplished. Any circuit or system providing this function can be used. FIG. 3 schematically shows two exemplary approaches for power splitting in a hybrid RF-acoustic relay. In relay 302 (top half of the figure), a single RF transceiver 106 provides power to rectifier 104 and to parallel and series impedances (308 and 306 respectively) of each of the acoustic transceivers 108, all in parallel. As is well known, the power splitting between rectifier 104 and acoustic transceivers 108 will be determined according to the impedances of these components, which can be selected to provide the desired power split. In relay 304 (bottom half of the figure), two RF transceivers 106a and 106b are employed that separately drive rectifier 104 and transceivers 108, respectively. Here the power split is determined by how RF transceivers 106a and 106b are sized and configured relative to external RF unit 102. In both cases, power from rectifier 104 to control impedances 306, 308 is shown by arrows 316 and 318, respectively. In more complex systems, any combination of circuit-based power splitting and RF transceiver-based power splitting can be used to perform this function including but not limited to one or more RF transceivers in 102, 106, 106a, 106b, etc.

Figure 4:
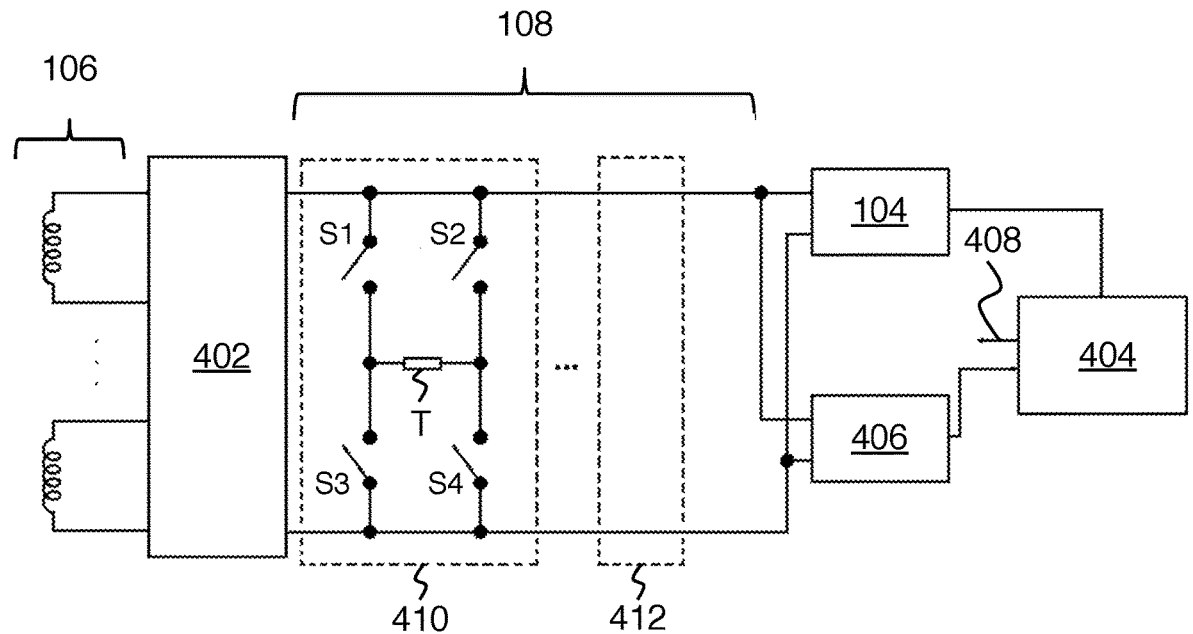
FIG. 4 schematically shows a first implementation approach for phase control in a hybrid RF-acoustic relay.
Figure 5:
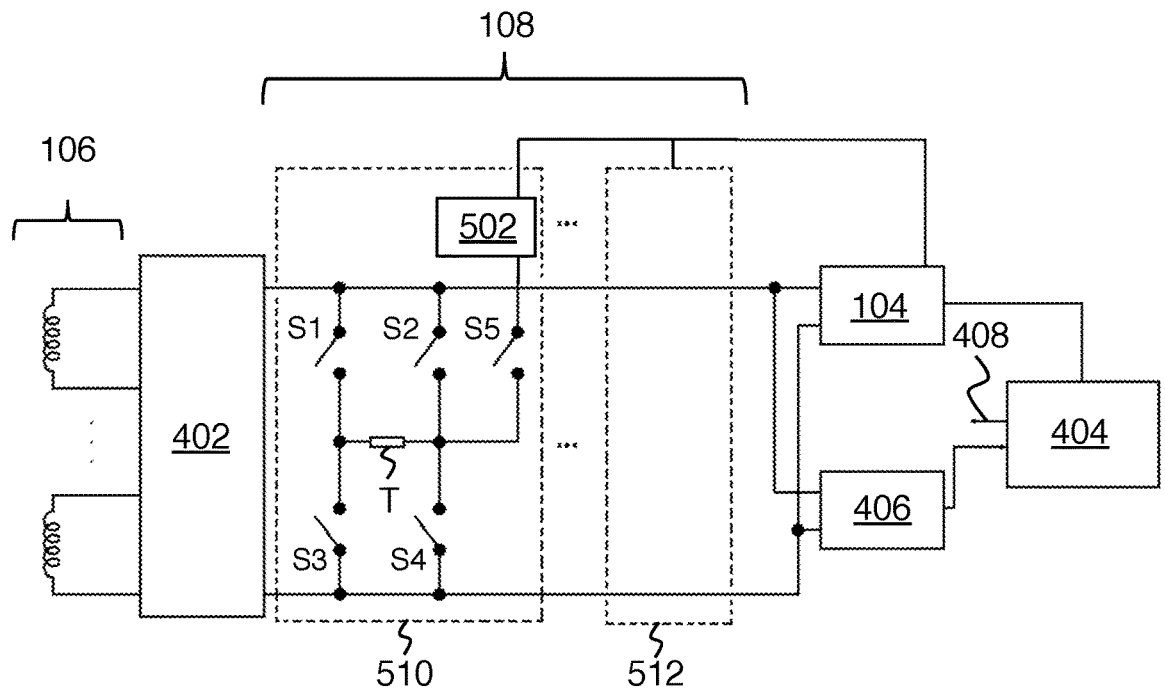
FIG. 5 schematically shows a second implementation approach for phase control in a hybrid RF-acoustic relay.
Figure 6:
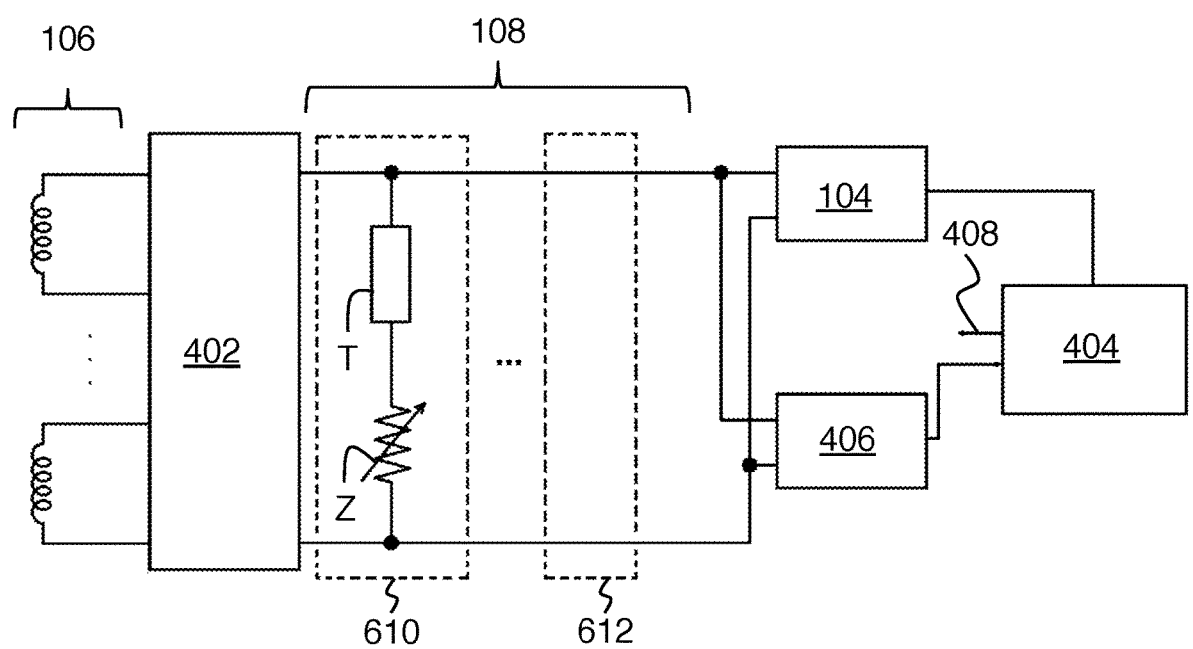
FIG. 6 schematically shows a third implementation approach for phase control in a hybrid RF-acoustic relay.

In preferred embodiments of the invention, the acoustic transceivers 108 are configured as a phased array of transceivers. FIGS. 4-6 relate to variations on how this phase control can be performed. Here it is important to note that the system architecture of using direct driving of the acoustic transceivers substantially alters the design of these phased arrays compared to conventional phased arrays.

More specifically, the conventional way to do beamforming is by rectifying all the power, and using the resulting DC power to drive acoustic transceiver array elements with the desired phase and frequency. Here that approach is not possible because of the direct driving of the acoustic transceiver array elements.

A major advantage of direct driving of the acoustic transceiver array elements is to miniaturize the size of matching circuits. Matching circuits are needed to tune out the imaginary impedance of the RF transceiver and acoustic transceiver elements. At the preferred frequency range between 100 kHz and 15 MHz for efficient power transfer, the size of capacitors and inductors needed to cancel the imaginary impedances of the transceiver elements are large and bulky, limiting miniaturization. By using direct driving, impedances of the acoustic transceivers can be considered to be in parallel so that the capacitances add into a larger effective capacitance. For thin, flexible transducers such as PVDF (polyvinylidene fluoride) and P(VDF-TrFE) (polyvinyledenedifluoride-trifluoroethylene), the impedance profile is capacitive. This allows for a reduction in the required inductance needed to cancel the imaginary impedance of the array of capacitive transducer elements by a factor of the array size squared, potentially allowing the imaginary impedance of the RF transceiver to cancel it.

FIG. 4 shows a first beamforming approach. Here RF transceivers 106 drive matching circuit 402 which drives acoustic transceivers 108 that form the array. These transceivers are referenced individually as 410, 412, . . . , and details are only shown within transceiver 410. Similar details are in all the other transceivers, but for simplicity this is not shown on the figure. The actual transducer element is referenced as T, and can be any acoustic transducer element, e.g., a piezoelectric element, capacitive micromachined ultrasonic transducer (CMUT), or a piezoelectric micromachined ultrasonic transducer (PMUT). Transducer T is surrounded by switches S1, S2, S3, S4 connected as shown, which provides a 1-bit phase control capability (e.g., 0 degrees, 180 degrees phase shift, or off) as follows.

If switches S1 and S4 are closed and switches S2 and S3 are open, the left side of T is connected to the top of 402 and the right side of T is connected to the bottom of 402. If switches S2 and S3 are closed and switches S1 and S4 are open, the right side of T is connected to the top of 402 and the left side of T is connected to the bottom of 402. The difference between these two configurations is a 180 degree phase shift (i.e., 1 bit of phase shift, in digital terms). Additionally the element can remained unused by leaving S1-S4 open. Single-bit phased arrays have been considered in the RF literature, but are inefficient due to poor beamforming and lossy switches making it a poor candidate for a power efficient system. However, for an array of acoustic transceivers and in this architecture, the high impedance piezoelectric material allows for small, low loss switches, making this single-bit approach unexpectedly attractive. For ultrasonic phased arrays which are primarily used for imaging, the system is not constrained by power consumption or heat dissipation. Therefore rectified DC power would be used to drive the phased array with high resolution phase.

FIG. 4 also shows further features of preferred embodiments of the invention. More specifically, these features are control block 404, control parameters 406, and control signals 408. Here control parameters 406 are inputs to control block 404 that determine how it functions. Most basically, control signals 408 can determine how switches S1, S2, S3, S4 are set for every element in the acoustic transceiver array, to provide the 1-bit phased array as described above.

However, many further features can be provided with such control and/or in addition to such control. For simplicity, these features are all described here in connection with FIG. 4, but they should be regarded as applicable to all embodiments of the invention, where possible. In one embodiment, received data is used to provide control parameters 406. Received data can come from received RF signals 112, received acoustic signals 206, or any combination of the two. In another embodiment, default values are used for control parameters 406.

Various system parameters can be controlled by control parameters 406. Such system parameters include, but are not limited to: RF and acoustic transceiver frequency, the fraction of incident RF power that is rectified, resistance and/or reactance of each acoustic transceiver array element, parameters of matching circuits 402, and determining what system data is sent as telemetry to external RF unit 102. Such telemetry can include but is not limited to: the amount of power in the RF transceivers, the location of the acoustically powered node(s), power requirements of the acoustically powered node(s), the number of acoustically powered node(s), data from the acoustically powered node(s), impedances of the acoustic transceiver(s), and/or temperature of the RF-acoustic relay.

In some variations, the external unit may regulate the transmitted power by using the temperature data from the RF-acoustic relay and/or from the acoustically powered node(s). In other variations, the external unit may regulate the transmitted power using coefficients of the link strength between the external unit and RF transceivers. One example is the mutual inductance between coils. In other variations, the external unit may regulate transmitted power using other sensor data on the RF-acoustic relay that may monitor the position(s) of the RF transceivers relative to the external unit. This can be done using optical sensors and light emitting structures, and/or additional RF transmitting and receiving structures. In some variations, the RF-acoustic relay may include additional sensors including pressure sensors, optical sensors, temperature sensors, and pH sensors. In other scenarios, the rectified power may be used to send the above mentioned data to adjust coefficients in additional RF structures placed between the external unit and RF transceivers such as resonant coils.

To summarize the preceding considerations, control parameters for control of the apparatus can be provided by RF data from the received RF signals and/or by acoustic data from the received acoustic signals. The received acoustic signals can directly affect the control parameters 406. Alternatively, the received acoustic signals can indirectly affect the control parameters 406 by being transmitted to external RF unit 102 which then alters RF signals received by the relay accordingly.

The example of FIG. 5 is similar to the example of FIG. 4, except that a variable signal generator 502 (analog or digital), which generates a signal with variable amplitude and phase, is provided within each of the acoustic transceivers 510, 512, etc. In other embodiments, 502 may be shared between 1 or more acoustic transceivers (e.g. 510, 512 . . . ). One implementation of the variable signal generator 502 would be using a reference frequency signal and rectified power from 104 to drive the acoustic transceiver with controllable amplitude and phase. The reference frequency signal is used to generate discrete digital phases and a DAC is used to generate digital amplitude levels, thus implementing a digital variable signal generator. The reference frequency signal could include but is not limited to the received RF signal at the RF transceiver, and a signal generated from a crystal oscillator. Other implementations include but are not limited to using delay lines formed from capacitors and inductors to implement an analog variable signal generator. The frequency of the signal generated from 502 can be the same frequency or different frequency than the received RF signals. Here in FIG. 5, a fifth switch S5 is added such that if S3, S5 are closed and S1, S2, S4 are open, the current path through transducer T includes variable signal generator 502. In this way, higher resolution phase control can be provided to the acoustic transceiver array, but more rectified power will be consumed, making it a design trade-off. The configuration of FIG. 4 can be regarded as having a series controllable impedance element that includes two or more switches to control the amplitude and phase. The amplitude can be controlled by varying the impedance of the switch when closed. In one implementation, this is done by selecting from a bank of differently sized switches to control the impedance, and in another implementation, different voltage levels are used to drive the switches.

FIG. 6 shows a third approach for controlling the array of acoustic transceivers. In this example, each of the acoustic transceivers 610, 612, . . . includes an acoustic transducer T and a series-connected variable impedance Z. Individual control of such series impedances (preferably both resistance and reactance) can be used to provide a degree of amplitude and/or phase control for the transceiver array. The rectified DC power can be used to tune the impedances Z of the acoustic transceivers by using switches, capacitors, rectifiers and/or inductors. In one realization, this can be implemented on a silicon chip to miniaturize the system. Such controllable impedances can be analog controllable impedances or digital controllable impedances. Analog controllable impedances are elements whose impedance vary continuously (e.g. varactor, variable resistor, etc.), and digital controllable impedances are elements whose impedance only take discrete levels (e.g. switch, switchable bank of impedance elements). This approach can provide multi-bit amplitude control to improve beamforming capability for direct driving. Using a rectifier in the variable impedance to adjust the current going into each transceiver allows recovery of this energy for other uses (calibration, feedback, data transmission etc.).

Figure 7:
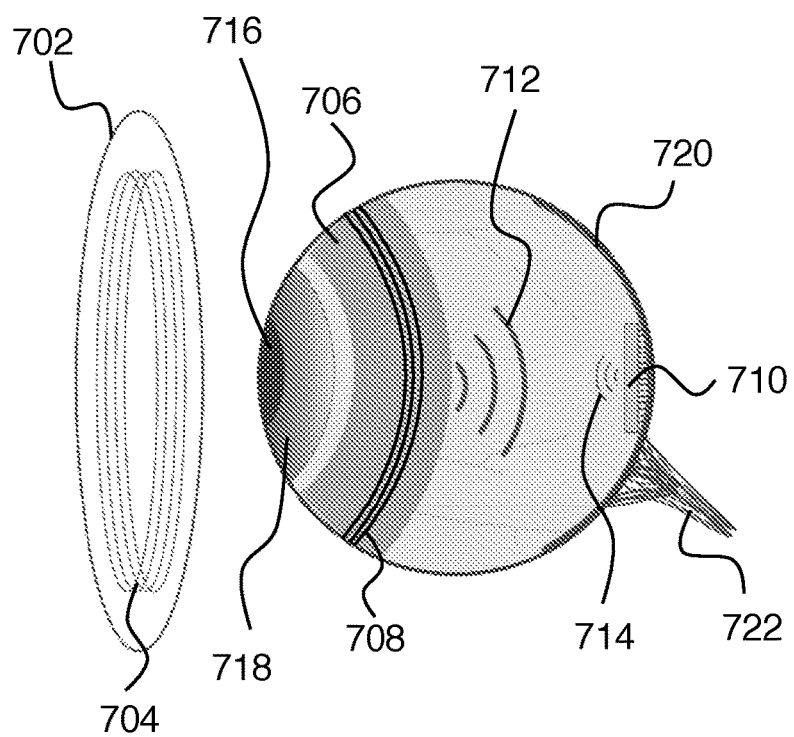
FIG. 7 shows application of principles of this work to a retinal implant system.

FIG. 7 shows application of principles of this work to a retinal implant system. In this example, the external RF unit 702 includes an RF coil 704 and is disposed on a wearable device configured to be worn by the patient. Glasses are a preferred wearable device for this application. The hybrid RF-acoustic relay 706 can be configured as a contact lens to be worn on an eye of a patient, and can include an inductive coil 708 to form an RF link with external RF unit 702. Alternatively, the relay can be configured to be implanted into the lens of the eye of a patient. A retinal implant 710 can include one or more acoustically powered nodes in acoustic communication with relay 706 as described above. Here transmitted acoustic signals from relay 706 to implant 710 are referenced as 712. Similarly, acoustic signals received at relay 706 from implant 710 are referenced as 714. For reference, some anatomical features of the eye are referenced as follows: pupil 716, iris 718, retina 720, and optic nerve 722.

Figure 8:
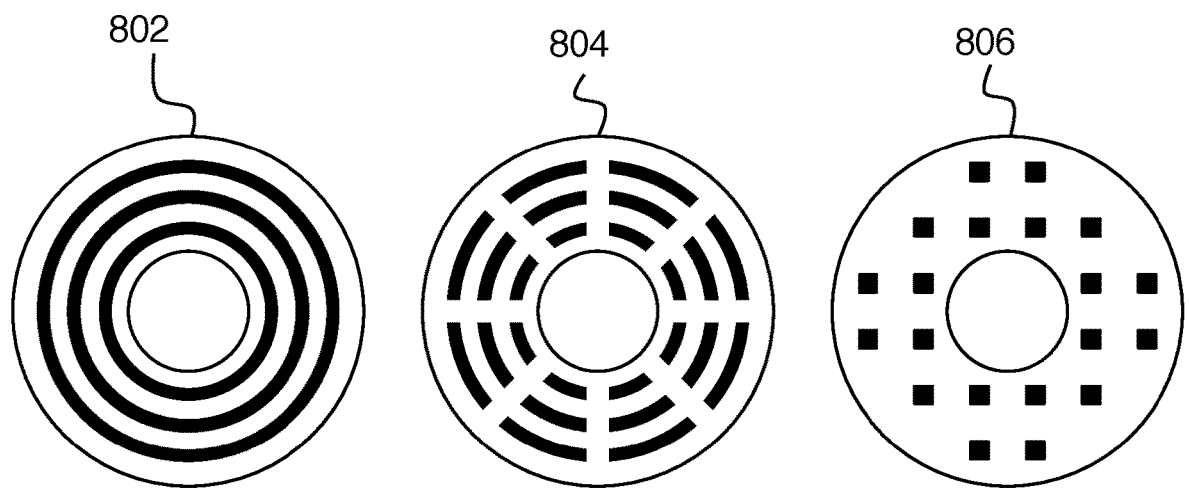
FIG. 8 shows several exemplary configurations for the ring transceiver of the example of FIG. 7.

The acoustic transceivers of relay 706 are preferably disposed in a ring such that the transmitted acoustic signals substantially do not pass through the lens of the eye of the patient. FIG. 8 shows several exemplary ring transceiver configurations for the example of FIG. 7. Here 802 is an annular transceiver array, 804 is a split array, and 806 is a 2D array.

To treat vision loss most effectively, the retinal implant should be in the back of the eye where cell density is high. When the acoustic transceivers of the relay are placed at the front of the eye, this facilitates focusing acoustic power to the retinal implant. A ring structure will further promote better oxygen perfusion to the eye allowing for long term usage of the relay 706. Preferred sizes of the arrays 802, 804,806 have an inner diameter of about 10 mm to avoid focusing to the lens of the eye of the patient and to allow oxygen and light to pass through the cornea. The preferred outer diameter is 18 mm to maximize the aperture size of the contact lens both for acoustic focusing and for the size of the inductive coil 708 on the relay 706. The contact lens may take the form of a scleral lens to accommodate the size and to increase mechanical stability of the relay 706 in relation to the eye.

In another form, the RF-acoustic relay may be placed outside the side of the eye on the sclera next to the skull. The relay can be fixed to a position on the side of the eye. The RF link can be used to transfer power across the bone and the acoustic transceiver makes good contact with the eye to efficiently couple energy to the retinal implant. In one form, the relay also communicates with the implant wirelessly using ultrasound in addition to powering it. In another form, the RF-acoustic relay may be implanted inside the eye under the sclera. In other forms, the RF-acoustic relay may be implanted into the intraocular lens or behind the lens.

Figure 9:
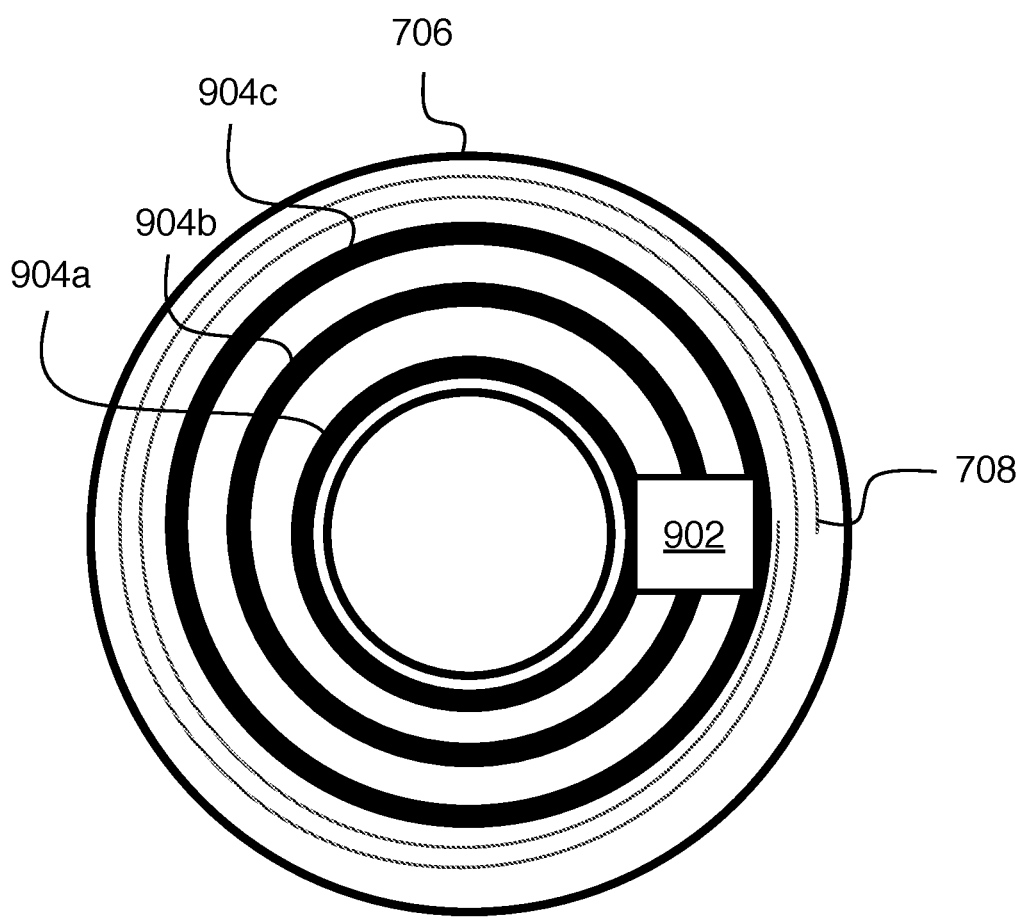
FIG. 9 shows an example of placement of different components of the hybrid RF-acoustic relay in a retinal implant system.

FIG. 9 shows an exemplary placement of different components onto the contact lens relay 706 for the retinal implant system. The inductive coil 708 may be implemented by depositing copper or other conductive metals near the exterior side and towards the periphery of the contact lens such that the outer diameter is similar to the outer diameter of the contact lens to maximize coil size. Acoustic transceivers 904a, 904b, 904c can be bonded to the contact lens material substrate on the interior side. Only three acoustic transceivers are shown in FIG. 9, but more acoustic transceiver elements such as 8 or 16 elements can be used. In preferred embodiments, the transceivers will cover as much area on the interior side of the contact lens as possible. Acoustic transceivers elements are preferably spaced closely together to maximize the aperture; an exemplary spacing is 50 µm. If biocompatible materials for the acoustic transducers are used such as PVDF, then the transducers can be directly exposed to the eye. In other embodiments, matching layers can be placed between the transducer and the eye to acoustically match. An electronic chip 902 can include various electronic components such as capacitors, inductors and can placed on the contact lens substrate towards the exterior side of the contact lens. Chip 902 can be connected to acoustic transceivers 904a, 904b, 904c, and the inductive coil 708 via metal traces such as copper (traces not shown, for simplicity). All other blocks of the relay 706 such as the rectifier, processor, controllable impedance, matching circuits, etc. can be implemented within chip 902 to minimize size and weight. The size of the electronic chip 902 may be approximately 3 mm by 3 mm, and the connections can be made using flip chip technology to minimize footprint of the device and to avoid bond wires to minimize size. In other embodiments, it can be wire bonded and epoxied to avoid breaking the wires when mounted in the contact lens. In preferred embodiments, the electronics or the whole contact lens are encased in water-proof soft packaging to extend the longevity of the device.

Due to low acoustic attenuation of the vitreous, carrier wave frequencies around 10 MHz are preferred for the RF and acoustic signals in the described retinal implant system. This allows for high focusing efficiency with minimal losses while increasing the bandwidth for data communication. In addition, higher frequency of operation allows miniaturization of required capacitances and inductances used in the matching circuits and of the thickness of the acoustic transducers since thickness scales roughly inversely with resonant frequency. Flexible, lightweight, and optically transparent materials for the transducers are preferred to allow more natural light to reach the eye for surviving vision in the patient and to accommodate the shape of the eye. Some example materials that satisfy these properties are PVDF and PVDF composites such as P(VDF-TrFE). These are materials with low thickness for a given resonant frequency, low density, flexibility and potentially optically transparency. Specifically at 10 MHz, the thickness at the resonant frequency is around 100 µm which is a suitable thickness for a scleral contact lens. At the thickest portion, the thickness of the transducer and electronic chip can be less than 300 µm which is still thinner than normal scleral lenses. The estimated weight of the relay including electronics, transducers, RF transceivers, and substrate material in this embodiment is around 150 mg. Other embodiments with different materials may include non-flexible transducers (e.g. PZT-4, PZT-5, $BaTiO_3$, PMN-PT (lead magnesium niobate-lead titanate), $LiNbO_3$) mounted on a flexible substrate.

The invention claimed is:

1. Apparatus configured as a hybrid RF-acoustic relay unit, the apparatus comprising:
   one or more RF transceivers configured to receive received RF signals from an external RF unit;
   one or more acoustic transceivers configured to transmit transmitted acoustic signals to one or more acoustically powered nodes, wherein each of the one or more acoustic transceivers includes at least one acoustic transducer;
   a power splitter configured to split incident power provided by the received RF signals into a first part and a second part;
   wherein power for the apparatus is provided by rectifying the first part;
   wherein the second part is used to directly drive the one or more acoustic transceivers such that an acoustic emission frequency of the one or more acoustic transceivers is the same as an RF frequency of the second part.

2. The apparatus of claim 1 wherein the one or more RF transceivers are configured to transmit transmitted RF signals to the external RF unit.

3. The apparatus of claim 1 wherein the one or more acoustic transceivers are configured to receive received acoustic signals from the one or more acoustically powered nodes.

4. The apparatus of claim 3, wherein control parameters for control of the apparatus are provided by RF data from the received RF signals and/or by acoustic data from the received acoustic signals.

5. The apparatus of claim 1, wherein at least one of the one or more acoustic transceivers includes a controllable impedance in series with its acoustic transducer.

6. The apparatus of claim 5, wherein the controllable impedance is an analog controllable impedance.

7. The apparatus of claim 5, wherein the controllable impedance includes two or more switches configured to provide digital amplitude and/or phase control.

8. The apparatus of claim 7, wherein at least one of the one or more acoustic transceivers includes a variable signal generator.

9. The apparatus of claim 8, wherein the variable signal generator is a digital variable signal generator.

10. The apparatus of claim 1, wherein control parameters for control of the apparatus are provided as predetermined default parameters.

11. The apparatus of claim 1, further comprising the external RF unit, wherein the external RF unit is disposed on a wearable device configured to be worn by the patient.

12. The apparatus of claim 1, wherein the apparatus is configured as a contact lens to be worn on an eye of a patient.

13. The apparatus of claim 12, wherein the one or more acoustic transceivers are disposed in a ring such that the transmitted acoustic signals substantially do not pass through a lens of the eye of the patient.

14. The apparatus of claim 12, further comprising the one or more acoustically powered nodes, wherein the one or more acoustically powered nodes are included in a retinal implant.

15. The apparatus of claim 1, wherein the apparatus is configured to be implanted into a lens of an eye of a patient.

16. The apparatus of claim 1, wherein the power splitter is configured such that the first part is 60% or less of the incident power provided by the received RF signals.

* * * * *